(12) United States Patent
Artman et al.

(10) Patent No.: US 10,185,379 B2
(45) Date of Patent: Jan. 22, 2019

(54) SYSTEMS AND METHODS FOR USAGE OF SECONDARY POWER SUPPLIES IN COMPUTING ENVIRONMENTS BASED ON RISK AND COST ASSESSMENTS

(71) Applicant: Lenovo Enterprise Solutions (Singapore) Pte. Ltd., New Tech Park (SG)

(72) Inventors: Paul Artman, Cary, NC (US); Fred A. Bower, Durham, NC (US); Gary D. Cudak, Wake Forest, NC (US); Ajay Dholakia, Cary, NC (US)

(73) Assignee: Lenovo Enterprise Solutions (Singapore) Pte. Ltd., New Tech Park (SG)

( * ) Notice: Subject to any disclaimer, the term of this patent is extended or adjusted under 35 U.S.C. 154(b) by 219 days.

(21) Appl. No.: 15/088,086

(22) Filed: Mar. 31, 2016

(65) Prior Publication Data
US 2017/0285704 A1     Oct. 5, 2017

(51) Int. Cl.
*G05F 1/26* (2006.01)
*G06F 1/32* (2006.01)
*G06F 1/26* (2006.01)

(52) U.S. Cl.
CPC .............. *G06F 1/263* (2013.01); *G06F 1/324* (2013.01)

(58) Field of Classification Search
CPC ................................. G06F 1/263; G06F 1/324
USPC ......................................................... 700/297
See application file for complete search history.

(56) References Cited

U.S. PATENT DOCUMENTS

| | | | |
|---|---|---|---|
| 2004/0070278 A1* | 4/2004 | Divan | H02J 3/006 307/64 |
| 2005/0071691 A1* | 3/2005 | Pomaranski | G06F 1/263 713/300 |
| 2010/0058092 A1* | 3/2010 | Bougaev | G06F 1/28 713/340 |
| 2011/0245988 A1* | 10/2011 | Ingels | G06F 1/26 700/295 |
| 2012/0109705 A1* | 5/2012 | Belady | G06Q 10/06312 705/7.22 |
| 2015/0074431 A1* | 3/2015 | Nguyen | H02J 3/006 713/300 |
| 2016/0195911 A1* | 7/2016 | Chapel | G06F 1/3287 713/340 |

* cited by examiner

*Primary Examiner* — Ziaul Karim
(74) *Attorney, Agent, or Firm* — Olive Law Group, PLLC

(57) ABSTRACT

Systems and methods for usage of secondary power supplies in computing environments based on risk and cost assessments are disclosed. According to an aspect, a method includes determining a risk value to a primary power source of a need to utilize a secondary power source for powering a plurality of computing devices. The method includes using the secondary power source to power a portion of the computing devices based on the determined risk value.

19 Claims, 2 Drawing Sheets

SYSTEMS AND METHODS FOR USAGE OF SECONDARY POWER SUPPLIES IN COMPUTING ENVIRONMENTS BASED ON RISK AND COST ASSESSMENTS

TECHNICAL FIELD

The present subject matter relates to computing device power supplies. More specifically, the present subject matter relates to systems and methods for usage of secondary power supplies in computing environments based on risk and cost assessments.

BACKGROUND

A data center is facility used to store computing devices, such as servers. For example, a data center may house computing systems and associated components such as telecommunications equipment and computing storage systems. Typically, a data center includes backup power supplies or secondary power supplies, redundant data communications connections, environmental controls, and various security devices.

Secondary power supplies may be used when a primary power source is compromised. For example, a primary power source may be compromised when an electrical grid system supplying power to the data center fails. In this case, a secondary power source, such as a battery backup system or generator, may be utilized to supply power to the data center. A secondary power source may be set up in such a way to serve particular systems, a rack, or multiple racks in a data center.

Powering and cooling data centers is becoming increasingly important factor to the total cost of operation. For this reason, it is desired to provide improved systems and techniques for managing data center power supplies.

SUMMARY

Disclosed herein are systems and methods for usage of secondary power supplies in computing environments based on risk and cost assessments. According to an aspect, a method includes determining a risk value to a primary power source of a need to utilize a secondary power source for powering a plurality of computing devices. The method includes using the secondary power source to power a portion of the computing devices based on the determined risk value.

BRIEF DESCRIPTION OF THE DRAWINGS

The illustrated embodiments of the disclosed subject matter will be best understood by reference to the drawings, wherein like parts are designated by like numerals throughout. The following description is intended only by way of example, and simply illustrates certain selected embodiments of devices, systems, and processes that are consistent with the disclosed subject matter as claimed herein.

DETAILED DESCRIPTION

Figure 1:
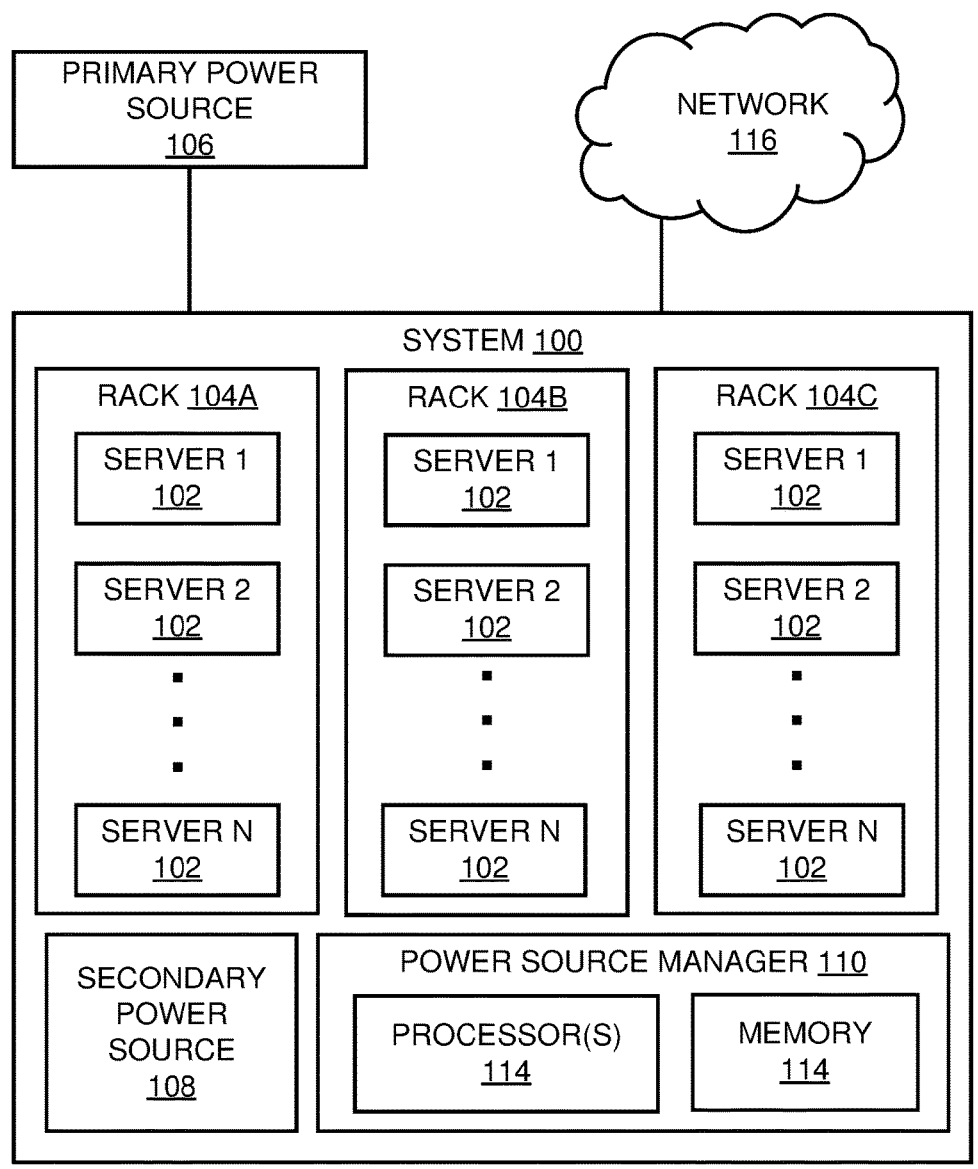
FIG. 1 is a block diagram of an example system for managing power supplies in accordance with embodiments of the present disclosure.

The following detailed description is made with reference to the figures. Exemplary embodiments are described to illustrate the disclosure, not to limit its scope, which is defined by the claims. Those of ordinary skill in the art will recognize a number of equivalent variations in the description that follows.

The functional units described in this specification have been labeled as computing devices. A computing device may be implemented in programmable hardware devices such as processors, digital signal processors, central processing units, field programmable gate arrays, programmable array logic, programmable logic devices, cloud processing systems, or the like. The computing devices may also be implemented in software for execution by various types of processors. An identified device may include executable code and may, for instance, comprise one or more physical or logical blocks of computer instructions, which may, for instance, be organized as an object, procedure, function, or other construct. Nevertheless, the executable of an identified device need not be physically located together, but may comprise disparate instructions stored in different locations which, when joined logically together, comprise the computing device and achieve the stated purpose of the computing device.

An executable code of a computing device may be a single instruction, or many instructions, and may even be distributed over several different code segments, among different applications, and across several memory devices. Similarly, operational data may be identified and illustrated herein within the computing device, and may be embodied in any suitable form and organized within any suitable type of data structure. The operational data may be collected as a single data set, or may be distributed over different locations including over different storage devices, and may exist, at least partially, as electronic signals on a system or network.

The described features, structures, or characteristics may be combined in any suitable manner in one or more embodiments. In the following description, numerous specific details are provided, to provide a thorough understanding of embodiments of the disclosed subject matter. One skilled in the relevant art will recognize, however, that the disclosed subject matter can be practiced without one or more of the specific details, or with other methods, components, materials, etc. In other instances, well-known structures, materials, or operations are not shown or described in detail to avoid obscuring aspects of the disclosed subject matter.

As referred to herein, the term "user interface" is generally a system by which users interact with a computing device. A user interface can include an input for allowing users to manipulate a computing device, and can include an output for allowing the computing device to present information and/or data, indicate the effects of the user's manipulation, etc. An example of a user interface on a computing device includes a graphical user interface (GUI) that allows users to interact with programs or applications in more ways than typing. A GUI typically can offer display objects, and visual indicators, as opposed to text-based interfaces, typed command labels or text navigation to represent information and actions available to a user. For example, a user interface can be a display window or display object, which is selectable by a user of a computing device for interaction. In another example, the user can use any other suitable user interface of a computing device, such as a keypad, to select the display icon or display object. For example, the user can use a track ball or arrow keys for moving a cursor to highlight and select the display object.

As used herein, the term "memory" is generally a storage device of a computing device. Examples include, but are not limited to, ROM and RAM.

The device or system for performing one or more operations on a memory of a computing device may be a software, hardware, firmware, or combination of these. The device or the system is further intended to include or otherwise cover all software or computer programs capable of performing the various heretofore-disclosed determinations, calculations, or the like for the disclosed purposes. For example, exemplary embodiments are intended to cover all software or computer programs capable of enabling processors to implement the disclosed processes. Exemplary embodiments are also intended to cover any and all currently known, related art or later developed non-transitory recording or storage mediums (such as a CD-ROM, DVD-ROM, hard drive, RAM, ROM, floppy disc, magnetic tape cassette, etc.) that record or store such software or computer programs. Exemplary embodiments are further intended to cover such software, computer programs, systems and/or processes provided through any other currently known, related art, or later developed medium (such as transitory mediums, carrier waves, etc.), usable for implementing the exemplary operations disclosed below.

In accordance with the exemplary embodiments, the disclosed computer programs can be executed in many exemplary ways, such as an application that is resident in the memory of a device or as a hosted application that is being executed on a server and communicating with the device application or browser via a number of standard protocols, such as TCP/IP, HTTP, XML, SOAP, REST, JSON and other sufficient protocols. The disclosed computer programs can be written in exemplary programming languages that execute from memory on the device or from a hosted server, such as BASIC, COBOL, C, C++, Java, Pascal, or scripting languages such as JavaScript, Python, Ruby, PHP, Perl, or other suitable programming languages.

The present disclosure is now described in more detail. For example, FIG. 1 illustrates a block diagram of an example system 100 for managing power supplies in accordance with embodiments of the present disclosure. Referring to FIG. 1, the system 100 includes servers 102 (server are numbered 1-N, wherein N is representative of any suitable number of servers within a rack) held within respective racks 104A, 104B, and 104C. The servers 102 their respective racks 104A, 104B, and 104C may be housed within a data center as will be appreciated by those of skill in the art. The servers 102 may be operably connected to equipment for sending and receiving data from computing devices outside of the data center. Although three racks are shown in the example of FIG. 1, it should be understood that the system 100 may include any suitable number of racks.

The system 100 is suitably connected to a primary power source 106 for supplying power to the servers 102. The primary power source 106 may be an electrical grid system as will be understood by those of skill in the art.

The system 100 includes a secondary power source 108. For example, the secondary power source 108 may be, but not limited to, a battery backup system, a generator (e.g., a fuel generator), a solar power system configured to supply power to one or more of the servers 102. For example, the secondary power source 106 may supply power to all or a portion of the servers 102 in a rack 104A, 104B, and/or 104C.

The system 100 includes a power source manager 110 configured to control the supply of power from the primary power source 106 and the secondary power source 108 to the servers 102. The power source manager 110 may be configured to individually control the supply of power from either the primary power source 106 or the secondary power source 108 to the servers 102. For example, the power source manager 110 may control the supply of power from the primary power source 106 to the servers 102 of rack 104A, while the servers 102 of racks 104B and 104C receive power from the secondary power source 108. In another example, the power source manager 110 may control any set of the servers (e.g., servers in the same rack or different racks) to receive power from the primary power source 106, while another set of servers receives power from the secondary power source 108.

The power source manager 110 is configured to determine a risk value to the primary power source 106 of a need to utilize the secondary power source 108 for powering the servers 102, determine costs associated with using the secondary power source 108 and the primary power source 106 for the servers 102; and use the secondary power source 108 to power all or some of the servers 102 based on the determined risk value and/or costs. The power source manager 110 may be implemented, for example, by one or more computing devices or any electronic component(s). The power source manager 110 may be implemented by suitable hardware, software, firmware, or combinations thereof. For example, the power source manager 110 may include one or more processors 112 and memory 114. The memory 114 may store instructions that can be implemented by the processor(s) 112 for implementing the functionality of the power source manager 110 disclosed herein.

Figure 2:
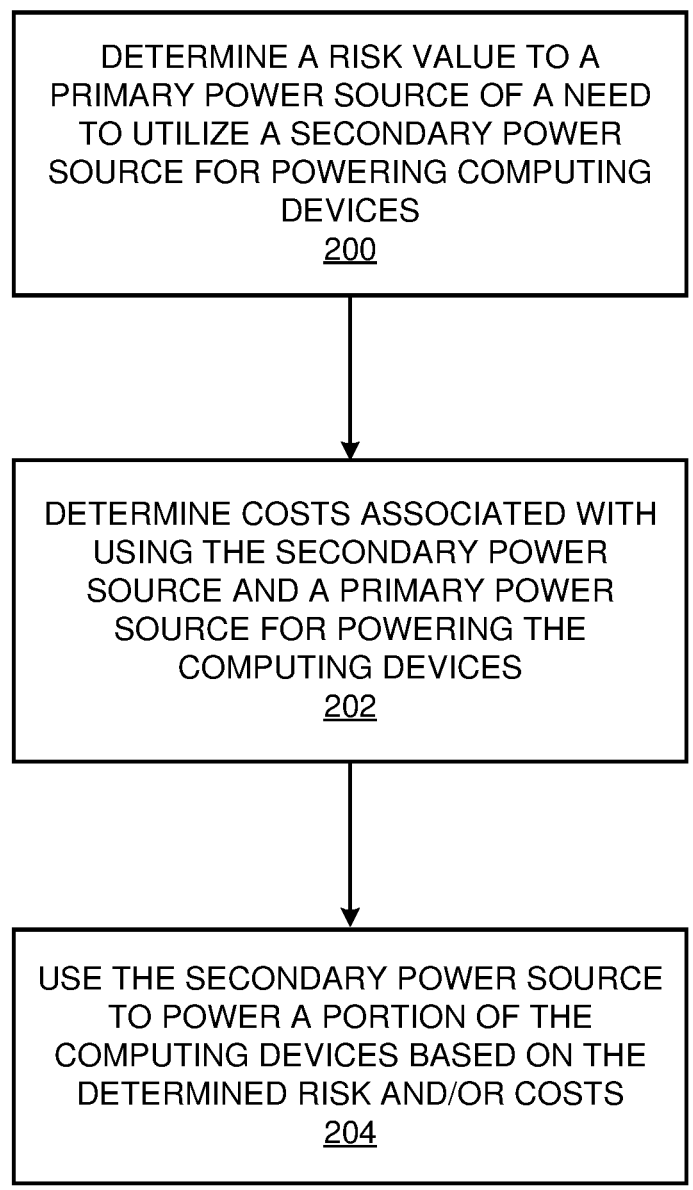
FIG. 2 is a flow chart of an example method for managing power supplies in accordance with embodiments of the present disclosure.

FIG. 2 illustrates a flow chart of an example method for managing power supplies in accordance with embodiments of the present disclosure. In the example of FIG. 2, reference is made to the system 100 and the primary power source 106 shown in FIG. 1. This is for the purpose of illustration, and it should be understood that any other suitable systems or power supplies may be used.

Referring to FIG. 2, the method includes determining 200 a risk value to a primary power source of a need to utilize a secondary power source for powering computing devices. As an example, the system 100 of FIG. 1 includes the secondary power source 108 operable to power all or just a portion of the servers 102. The secondary power source 108 operates as a backup to the primary power source 106 in instances when the primary power source is unable to adequately supply power to the servers 102. The power source manager 110 may be configured to determine that the primary power source is unable to supply power and control the switch to the secondary power source 108 in such an instance. The power source manager 110 may be configured to determine a risk value to the primary power source 106 of a need to utilize the secondary power source 108 for powering the servers 102. For example, the power source manager 110 may determine a likelihood that a weather condition will disable the primary power source 106. For example, the power source manager 110 may be communicatively connected to a network 116 (e.g., the Internet or another suitable network) and configured to retrieve weather forecasts. A forecast for severe weather and its likelihood can be used by the power source manager 110 for determining a likelihood that the forecasted weather condition will disable the primary power source 106. This information can be useful because it can be indicative of a need to use the secondary power source 108 to replace the primary power source 106.

In another example, a determination of risk value to a primary power source of the need to utilize a secondary power source can be based on an analysis of media content. For example, the power source manager 110 may access media content such as, but not limited to, a news report via the network 116. The media content may be a news article posted to a website. The news report may indicate that there is a potential for electrical outage within a geographic area containing the system 100. In this case, the power source manager 110 may determine that there is a high likelihood that the secondary power source 108 will be needed to replace the primary power source 106.

In another example of determining a risk value to a primary power source, the risk value determination may be based on an administrator setting. Example administrator settings include, but are not limited to, a time of power usage by one or more servers, an amount of power usage by one or more servers, a cost of using the primary power source to power one or more servers, and the like. In an example, an administrator can make settings changes in administration software or any suitable software or control for monitoring the power subsystem.

The method of FIG. 2 includes determining 202 costs associated with using the secondary power source and a primary power source for powering the computing devices. Continuing the aforementioned example, the power source manager 110 may determine costs associated with using the primary power source 106 and the secondary power source 108. For example, an administrator may enter that a power source costs one or more servers cost $0.12 per kilowatt hour (KWH) between 8:00 am and 5:00 pm, and that the same power source costs $0.11 per kilowatt hour (KWH) between 5:00 pm and 8:00 am. This cost information can be used as a basis for a determination about whether to switch from the primary power source 106 to the secondary power source 108, and vice versa. A switch may be considered by the power source manager 110 in the instance that it is lower cost to utilize the power source that is not currently being utilized.

In an example of switching to a different power source based on cost information, the power source manager 110 may determine whether the cost of using a primary power source exceeds the cost of using a secondary power source. In response to determining that the cost of using the primary power source exceeds the cost of using the secondary power source, the power source manager 110 may control the supply of power to switch from the primary power source to the secondary power source. Other factors in determining whether to switch may be based on the risk of utilizing the secondary power source as will be discussed further herein.

The method of FIG. 2 includes using 204 the secondary power source to power a portion of the computing devices based on the determined risk value and/or costs. Continuing the aforementioned example, the secondary power source 108 may be used to power a portion or all of the servers 102 shown in FIG. 1. The power source manager 110 may control the switch to be made from the primary power source 106 to the secondary power source 108. The determination of whether to switch to a different power source can depend on the aforementioned risk value and cost determination. For example, the power source manager 110 may determine that it costs less to operate a battery backup than the primary power source. In this example, the power source manager 110 may also determine that the risk is low the primary power source not being available to switch to when the battery backup is at low power supply. In this example scenario, the power source manager 110 may determine to switch to the battery backup when the cost is less for the secondary power source and the risk is low that the primary power source would be unavailable if the battery backup depleted its power from powering the servers.

It is also noted that the determination of whether to use the secondary power source may be only determined based on the risk without consideration of cost.

In accordance with embodiments, the power source manager may switch to the secondary power source in response to the risk of needing to utilize a secondary power source meets a predetermined threshold. For example, the risk of the primary power source being unable within the next may be greater than 50%. In this case, the power source manager may determine not to switch to the secondary power source even though the secondary power source is less costly than the primary power source. This determination may be because the risk is too great and battery backup, for example, may need to be conserved in the case that the primary power source becomes unavailable. In another example scenario in which the risk is 10%, the power source manager may determine to switch to the lower cost secondary power source due to the low likelihood of the primary power source being needed.

In accordance with embodiments, the power source manager may determine whether power consumption of different sets of computing devices (e.g., servers) by the primary power source exceeds a predetermined threshold. For example, an administrator may set a threshold level of power consumption from the primary power source. In response to determining that the threshold is exceeded, the power source manager may use the secondary power source to power one set of the computing devices in order to lower the power consumed by the primary power source to less than the threshold. In this way, use of the primary power source can be managed by concurrent use of the secondary power source to power one or more computing devices (e.g., servers).

In another example, the administrator may enter a setting for a particular set of computing devices, such as a rack of servers. The setting may be that the power consumption of the set from a primary power source cannot exceed a particular level during a period of time (e.g., 5 kilowatts from 8:00 am to 5:00 pm). In this instance, a switch may be made to the secondary power source if this condition is met.

In another example, an administrator setting may be based on a workload queue or demand. For example, a set of workloads may have a completion time requiring additional power, and the secondary power source may be used to meet the requirement. In an example scenario, a server rack may require operating at 7 kilowatts to achieve a workload completion within a desired timeframe. A secondary power source may be used to meet the requirement.

In accordance with embodiments a battery backup or other secondary power source may be engaged to halt ingress of power from a primary power source for a duration. Further, for example, a battery backup may redirect power from the battery to specific ports, rather than pass through a primary power source. In another example, a battery backup can halt certain feeds of power to some racks or computing devices.

In an example use, a secondary power source may be used to stay within a particular power usage envelope for a primary power source. For example, an administrator may set a temporary operating envelope of 20 kilowatts for a period of time. The current workload is driving 26 kilowatts in this example. Rather than throttle the operation of systems, one server rack may be moved to operator from the secondary power source for a period of time.

In another example use, specific systems within a server rack may be targeted by driving battery supply to specific ports on a battery or other secondary power source.

In accordance with embodiments, systems and method can be operated to use a secondary power source to augment operation of an oversubscribed power subsystem, or primary power source.

The present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the present disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
storing, by a processor, a program in memory;
receiving, by the processor, media content from a second computing device connected in a computing network;
connecting, by the processor, to a primary power source and a secondary power source, wherein the primary power source and secondary power source provides power to a plurality of computing devices;
executing the program, by the processor;
determining, by the processor, the amount of power usage of the primary power source being utilized to power the plurality of computing devices;
determining, using the processor, a risk value to the primary power source, wherein the risk value is based on the received media content and amount of power usage; and
halting ingress of power, by the processor, from the primary power source;
redirecting, by the processor, power from the second power source to a first power port of the primary power source based on the risk value, the media content, and a cost of using the primary power source; and
activating, by the processor, the secondary power source to power a portion of the computing devices based on the determined risk value the media content, and the cost of using the primary power source.

2. The method of claim 1, wherein the computing devices are servers operating within a data center.

3. The method of claim 1, wherein determining a risk value comprises determining a likelihood that a weather condition will disable the primary power source, and
wherein using the secondary power source comprises using the secondary power source to power the portion of the computing devices based on the likelihood of the weather condition.

4. The method of claim 1, wherein determining a risk value comprises determining the risk value based on the analysis of media content, and
wherein using the secondary power source comprises using the secondary power source to power the portion of the computing devices based on the analysis of media content.

5. The method of claim 1, wherein determining a risk value comprises determining the risk value based on an administrator setting, and
wherein using the secondary power source comprises using the secondary power source to power the portion of the computing devices based on the administrator setting.

6. The method of claim 5, wherein the administrator setting includes one or more of a time of power usage by the portion of the computing devices, and the amount of power usage by the portion of the computing devices.

7. The method of claim 1, wherein determining a risk value comprises determining a risk value of a need to utilize one of a battery backup system, generator, and solar power system for powering the computing devices.

8. The method of claim 1, wherein using the secondary power source comprises using the secondary power source to power portions of two or more of the computing devices.

9. The method of claim 1, further comprising determining costs associated with using the secondary power source and a primary power source for powering the computing devices, and
wherein using the secondary power source comprises using the secondary power source to power a portion of the computing devices based on the determined risk value and the determined costs.

10. The method of claim 9, further comprising:
determining whether the cost of using the primary power source exceeds the cost of using the secondary power source; and
in response to determining that the cost of using the primary power source exceeds the cost of using the secondary power source, switching from the primary power source to the secondary power source.

11. The method of claim 10, wherein switching from the primary power source to the secondary power source comprises switching from the primary power source to the secondary power source in response to determining that the determined risk meets a predetermined threshold.

12. The method of claim 1, wherein using the secondary power source comprises using the secondary power source to power a server rack with a data center.

13. The method of claim 1, wherein the plurality of computing devices comprises a first set of computing devices and a second set of computing devices,
wherein the method comprises:
determining whether power consumption of the first and second sets of computing devices by the primary power source exceeds a predetermined threshold; and
in response to determining that power consumption of the first and second sets of computing devices exceeds a predetermined threshold, using the secondary power source to power the second set of computing devices to lower the power consumed by the primary power source to less than the predetermined threshold.

14. The method of claim 1, further comprising using the primary power source and the secondary power source simultaneously to power the computing devices.

15. The method of claim 14, further comprising using both the primary power source and the secondary power source simultaneously on different portions of the computing devices for aligning workloads.

16. The method of claim 1, further comprising analyzing usage of the primary power source and the secondary power source for reducing costs.

17. A system comprising:
a plurality of computing devices connected in a network;
a primary power source and a secondary power source that provide power to the computing devices;
at least one processor and memory that:
stores a program in the memory;
receives, by the processor, media content from a second computing device connected in a computing network;

connects, by the processor, to a primary power source and a secondary power source, wherein the primary power source and secondary power source provides power to a plurality of computing devices;

executes, by the program;

determines, using the processor, the amount of power usage of the primary power source being utilized to power the plurality of computing devices;

determines, using the processor, a risk value to the primary power source, wherein the risk value is based on the received media content and amount of power usage; and halts ingress of power, by the processor, from the primary power source;

redirects, by the processor, power from the second power source to a first power port of the primary power source based on the determined risk value, the media content, and a cost of using the primary power source; and activates, by the processor, the secondary power source to power a portion of the computing devices based on the determined risk value, the media content, and the cost of using the primary power source.

18. The system of claim 17, wherein the computing devices are servers operating within a data center.

19. The system of claim 17, wherein the risk value comprises a risk value of a need to utilize one of a battery backup system, generator, and solar power system for powering the computing devices.

* * * * *